United States Patent [19]

Marisetty

[11] Patent Number: 5,666,521
[45] Date of Patent: Sep. 9, 1997

[54] METHOD AND APPARATUS FOR PERFORMING BIT BLOCK TRANSFERS IN A COMPUTER SYSTEM

[75] Inventor: Suresh K. Marisetty, San Jose, Calif.

[73] Assignee: Intel Corporation, Santa Clara, Calif.

[21] Appl. No.: 752,952

[22] Filed: Nov. 20, 1996

Related U.S. Application Data

[63] Continuation of Ser. No. 494,179, Jun. 23, 1995, abandoned, which is a continuation of Ser. No. 986,476, Dec. 7, 1992, abandoned.

[51] Int. Cl.⁶ .................... G06F 13/00; G06F 13/16
[52] U.S. Cl. .................... 345/525; 345/511; 345/521; 711/169
[58] Field of Search .................... 395/501, 508, 395/509, 510, 511, 515, 517, 521, 525, 405, 432, 496, 421.07

[56] References Cited

U.S. PATENT DOCUMENTS

| | | | |
|---|---|---|---|
| 4,475,176 | 10/1984 | Ishii | 364/900 |
| 4,980,828 | 12/1990 | Kapcio et al. | 365/230.05 |
| 5,047,760 | 9/1991 | Trevett . | |
| 5,072,420 | 12/1991 | Conley et al. | 395/425 |
| 5,111,386 | 5/1992 | Fujishima et al. | 395/425 |
| 5,210,723 | 5/1993 | Bates et al. | 365/230.06 |
| 5,226,139 | 7/1993 | Fujishima et al. | 395/425 |
| 5,249,266 | 9/1993 | Dye et al. | 395/162 |
| 5,251,298 | 10/1993 | Nally | 395/166 |
| 5,265,218 | 11/1993 | Testa et al. | 395/425 |
| 5,282,177 | 1/1994 | McLaury | 365/230.05 |
| 5,301,278 | 4/1994 | Bowater et al. | 395/275 |

*Primary Examiner*—Kee M. Tung
*Assistant Examiner*—U. Chauhan
*Attorney, Agent, or Firm*—Blakely, Sokoloff, Taylor & Zafman

[57] ABSTRACT

A method and apparatus for performing fly-by transfer in a memory subsystem of a computer system. The present invention transfers data between a display memory and the system memory in the memory subsystem using common data and address buses. To complete a transfer between the two, the RAS is activated for both the display and system memory banks and then the CAS signal is cycled for both the display memory and the system memory, thereby causing a page mode transfer of the data between the two memories without having to use the system bus of the computer system.

22 Claims, 2 Drawing Sheets

METHOD AND APPARATUS FOR PERFORMING BIT BLOCK TRANSFERS IN A COMPUTER SYSTEM

This is a continuation of application Ser. No. 08/494,179, filed Jun. 23, 1995, now abandoned, which is a continuation of application Ser. No. 07/986,476, filed Dec. 7, 1992, now abandoned.

FIELD OF THE INVENTION

The present invention relates to the field of computer systems; particularly, the present invention relates to computer systems which utilize a display device that includes a frame buffer.

BACKGROUND OF THE INVENTION

Computer systems use a variety of means for displaying information on a display device. Such display devices typically include cathode my tube (CRT) display devices, liquid crystal devices, hard copy print devices, or other output devices accessible to the processor of the computer system. These display devices usually include frame buffers. A frame buffer is a portion of the computer system memory that has a predefined correspondence between a buffer memory location and a point on a display screen. The processor of the computer system is normally responsible for loading and maintaining the contents of a frame buffer memory.

Most computer systems include some form of Random Access Memory (RAM). The system memory of a large portion of computer systems typically includes Dynamic RAM (DRAM) devices. One type of DRAM used in system memories is a page mode DRAM. Page mode DRAMs allow an entire row of memory to be accessed by holding the row access strobe (RAS) signal active while strobing each of the column addresses with the column access strobe (CAS) until the entire row is accessed.

Frame buffer memories are usually implemented using Video RAM (VRAM) devices. One type of VRAM is the page mode VRAM, which is accessed in the same manner as that of the page mode DRAM. The processor of the computer system accesses VRAM in a similar manner to an access to any computer system memory (e.g., DRAM) by applying an address, various control signals and data to the input of the VRAM. However, unlike system memory or DRAM, VRAM devices usually include an additional output port to which a digital-to-analog converter (DAC) is connected. The DAC converts the data received from the VRAM from digital to analog for display. A CRT display is coupled to the DAC to receive the analog data and display the data. Display elements or picture elements (pixels) can be selectively enabled or disabled on the CRT display by outputting frame buffered data from the VRAM through the DAC and onto the CRT display. Rows of the display elements (also called scan lines) can be displayed using hardware within the VRAM, the DAC, and the CRT display. Because each scan line must be clocked out of VRAM separately, some control means must be present in the computer system for performing this display control function.

In current computer system implementations, two memory controllers are used: one for controlling DRAM devices (i.e., the system memory) and another for controlling VRAM devices (i.e., the frame buffer or display memory). Two memory controllers are necessary in prior art implementations because of the differences between controlling the DRAM and VRAM devices. For instance, the frame buffer output control function is not necessary for DRAM devices. However, many similarities exist in the control of DRAM and VRAM devices. The manner in which the processor accesses-to the two types of devices is virtually identical. Because of the many similarities in the control of DRAM and VRAM devices, some level of component, redundancy is introduced when two memory controllers are used. This redundancy is one factor contributing to the increased cost of the dual memory controller implementation.

In current computer systems, data is often moved between the system memory and the video, or graphics, memory. These data transfers are often referred to as screen-to-memory and memory-to-screen bit block, or fly-by, transfer operations. For example, in a windowing type application, where one particular window is to appear on top of another window, the data corresponding to the covered window in the screen is sent from the frame buffer to the main system memory, while the portion corresponding to the covering window is sent to the video memory to be displayed on the screen.

In prior art computer systems, the frame buffer is typically on a different bus than that of the system memory. Therefore, in order to perform screen-to-memory and memory-to-screen transfers, the device or circuitry controlling the transfer has to become the bus owner of more than one bus to transfer the data (i.e., the system bus and the graphics bus). The bus ownership and transfer of data using two disjoint or isolated locations involves much overhead (i.e., multi-bus arbitration, bus bridge latencies and bus bandwidths) and, thus, causes the transfers to occur very slowly. The transfers are typically slow because the I/O bus on which the frame buffer transfers data is usually slower than most buses (e.g., graphics buses).

When transfers are performed in computer systems, the transfers normally include reading data from one location and writing it to another location using a memory controller. One common transfer occurs between a system memory location and an I/O location. In a typical memory system, in order to perform a transfer to an I/O device, an access occurs to obtain the data from one location (i.e., the source location), and then another access to the other location (i.e., the destination location) is required in order to complete the transfer. For instance, the CPU of the computer system would perform an access to a memory device on the bus to obtain data (i.e., a read operation). The CPU would then perform a write operation, such that the data is sent to its destination I/O device. In this situation, since both devices share the same buses, only one memory address is utilized (i.e., required), for the address is required only when reading the data. A special address is not required for each of the I/O devices due to the use of data acknowledge signals (DACKs) that are driven by the direct memory access (DMA) controller in the system. These DACKs are dedicated lines which select a particular memory element and/or I/O device for a data access.

In the prior art, memory-to-memory transfers are performed. However, one problem associated with memory-to-memory transfers in the prior art is that the memories usually share the same address and data buses, yet use different addresses or addressing schemes. Because an address in one memory may not correspond to the same address in the other memory, two separate accesses must be performed. In other words, when transferring data from one address in a first memory to a different address in a second memory while sharing the same address and data buses, two separate accesses must occur. First, a read cycle using the address location in the first memory must be performed to obtain the data. Once the data has been obtained, a write cycle must be completed to write the data into different data address in the second memory.

As will be shown, the present invention provides a method and apparatus for performing fly-by bit block transfers between different portions of the same memory. The present invention also provides for fly-by transfers between VRAM and DRAM devices in the same memory. The present invention provides a method and apparatus for performing fly-by bit block transfers in a linear frame buffer, such that data can be transferred between the computer display screen and the system memory without using the slower system bus. Likewise, the present invention allows for transfers to occur between the video memory and system memory while using shared data and address buses.

SUMMARY OF THE INVENTION

A method and apparatus for performing fly-by transfer in a memory subsystem is described. The present invention transfers data between a first memory and a second memory in the memory subsystem. The first and second memories share common data and address buses. One of the memories is a display memory.

The present invention includes a method and means for strobing the row address of the first memory, such that a valid row address appears on the shared address bus. The present invention also provides a method and means for activating a read data indication signal for the first memory and then strobing the column address of the first memory, such that data is driven onto the shared data bus from the first memory. The present invention also provides a method and means for strobing the row address of the second memory while the read data indication signal from the first memory is active, such that a valid row address for the second memory appears on the shared address bus. The present invention also includes a method and means for strobing the column address of the second memory while the read data indication signal is active and while a write data indication is active for the second memory, such that the data is written from the shared data bus into the second memory.

BRIEF DESCRIPTION OF THE DRAWINGS

The present invention will be understood more fully from the detailed description given below and from the accompanying drawings of the preferred embodiments of the invention, which, however, should not be taken to limit the only.

DETAILED DESCRIPTION OF THE INVENTION

A method and apparatus for providing fly-by bit block transfers in a computer system is described. In the following description numerous specific details are set forth, such as specific numbers of memory banks, specific numbers of row and column address strobes, etc., in order to provide a thorough understanding of the preferred embodiment of the present invention. It will be obvious to one skilled in the art that the present invention may be practiced without these specific details. Also, well-known circuits have been shown in block diagram form, rather than in details, in order to avoid unnecessarily obscuring the present invention.

Figure 1:
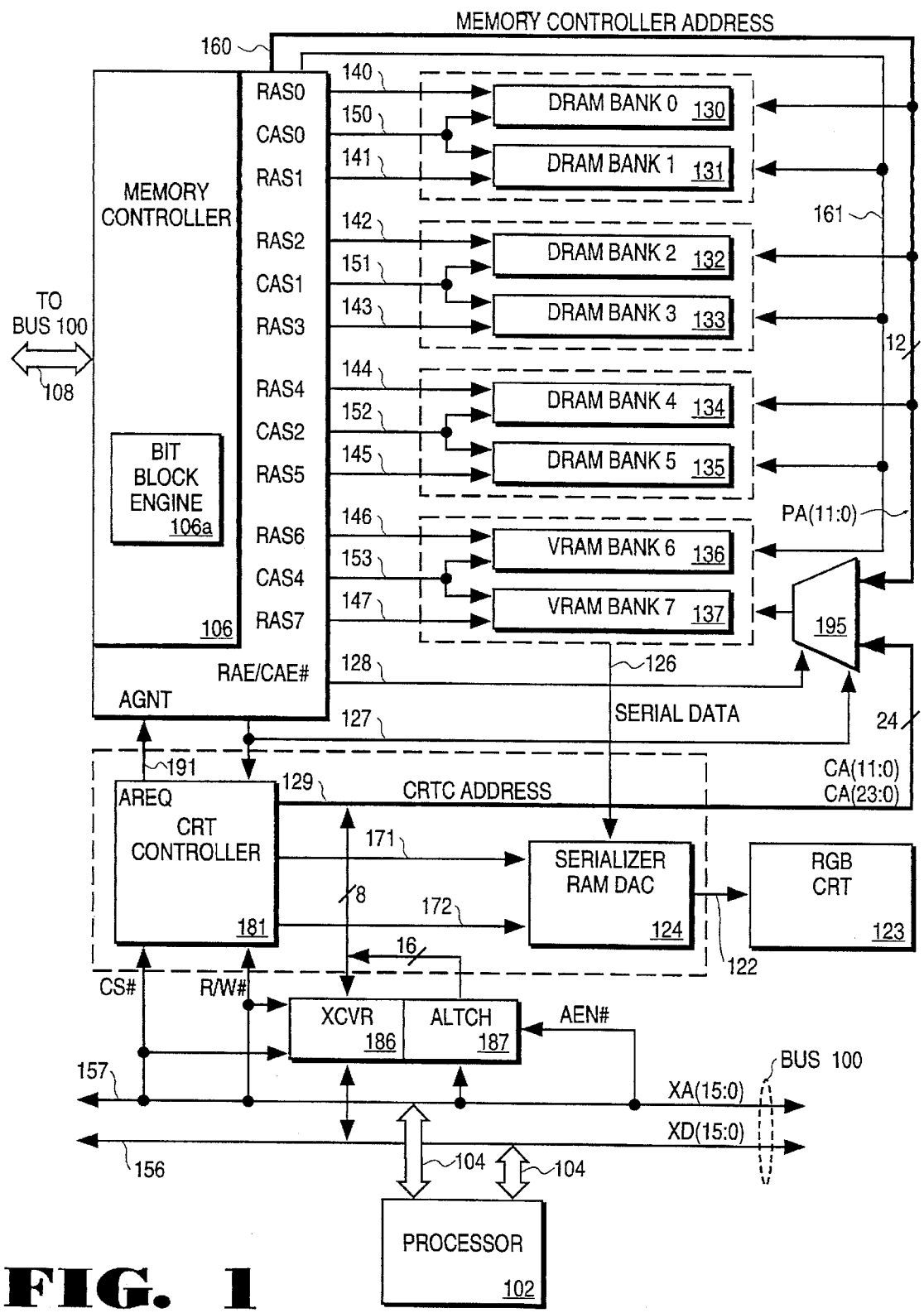
FIG. 1 is a block diagram of the computer system of the present invention.

FIG. 1 illustrates a computer system of the present invention. Referring to FIG. 1, the currently preferred embodiment includes bus 100 for communicating information and processor 102 coupled to bus 100 via interface 104. In the currently preferred embodiment, processor 102 is an Intel i486™SL brand microprocessor manufactured by Intel Corporation of Santa Clara, Calif., the assignee of the present invention. A memory controller is coupled to bus 100 via interface 108. In the currently preferred embodiment, memory controller 106 is implemented using programmable logic array (PLA) devices. PLA devices are well-known in the art.

Memory controller 106 provides a means for accepting a memory access request presented to memory controller 106 on interface 108. A memory access request includes address signals and control signals. In the currently preferred embodiment, these signals are converted by memory controller 106, such that the signals are appropriate for either Dynamic Random Access Memory (DRAM) devices 130–135 or a video Random Access Memory (VRAM) devices 136–137. Data lines 161 provide the data path for passing data into DRAMs 130–135 or VRAMs 136–137 during write operations or passing data from DRAMs 130–135 or VRAMs 136–137 during read operations. Memory controller 106 also generates Row Address Strobe (RAS) signals 140–147 and Column Address Strobe (CAS) signals 150–153 for the banks 130–137 in the memory system. These RAS and CAS signals are used for addressing the appropriate data item within DRAM banks 130–135 or VRAM banks 136–137. In addition, write enable (WE) signals are used for indicating write or read operations. The WE signals in the present invention are well-known in the art end are not shown to avoid obscuring the present invention.

As illustrated in FIG. 1, the system memory includes six DRAM banks 130–135 and two VRAM banks 136 and 137. Note that the specific number of DRAM and VRAM banks utilized is variable. For instance, the system memory could include seven DRAM banks and one VRAM bank.

DRAM bank 130 is coupled to receive RAS0 140 and CAS0 150 from memory controller 106. DRAM bank 131 is coupled to receive RAS1 141 and CAS0 150 from memory controller 106. DRAM bank 132 is coupled to RAS2 142 and CAS1 151 from memory controller 106. DRAM bank 133 is coupled to receive RAS3 143 and CAS1 151 from memory controller 106. DRAM bank 134 is coupled to receive RAS4 144 and CAS2 152 from memory controller 106. DRAM bank 135 is coupled to receive RAS5 145 and CAS2 142 from memory controller 106. VRAM bank 136 is coupled to receive RAS6 146 and CAS3 153 from memory controller 106. VRAM bank 137 is coupled to receive RAS7 147 and CAS3 153 from memory controller 106.

Memory controller 106 is also coupled via the internal address bus 160 and internal data bus 161 to DRAM banks 130–135 and VRAM banks 136–137. In the present invention, buses 160 and 161 are used to perform data transfers to and between all banks in the memory. In the currently preferred embodiment, address bus 160 comprises a 12-bit address bus. Therefore, the control and data signals provided by memory controller 106 are coupled to DRAM banks 130–135 and VRAM banks 136–137, along with RAS signals 140–147 CAS signals 150–153. Memory controller 106 controls both DRAM banks 130–135 and VRAM banks 136–137 with the same circuitry. By designating the appropriate row and column addresses using RAS signals 140–147 and CAS signals 150–157, memory controller 106 is able to access any location in the memory space.

In the currently preferred embodiment, memory controller 106 includes control circuitry for controlling accesses to the system memory (i.e., DRAM banks 130–135) and control circuitry for controlling accesses to the video memory (i.e., VRAM banks 136–137). The circuitry that controls VRAM banks 136–137 provides the function of a frame buffer controller, such that it controls data transfer cycles to DAC 124. Memory controller 106 also includes timing and address generation logic for VRAM banks 136–137 and DRAM banks 130–135. By allowing memory controller 106 to control accesses to and from both DRAM banks 130–135 and VRAM banks 136–137 in the present invention, memory controller 106 is an integrated graphics memory controller. Thus, memory controller 106 controls and accommodates both graphics and non-graphic applications.

In the currently preferred embodiment, memory control 106 is fabricated on a single metal-oxide semiconductor (MOS) device with the frame buffer controller portions and timing and address generation portions internal therein. Signals interfacing memory controller 106 are provided at input and output pins of the semiconductor chip. By incorporating the DRAM and VRAM controller functions onto a single semiconductor chip, the cost of the system is reduced and the efficiency and performance is increased. The present invention has a linear frame buffer system with video memory control functions integrated in a single memory controller chip with the system memory control functions.

In the present invention, to access one of DRAM banks 130–135 and VRAM banks 136–137, memory controller 106 receives memory access requests from processor 102 via bus interface 108. These memory access requests include reads and writes from memory. The read memory request includes an address from which data should be read and various control signals for specifying the read operation. A write data request includes an address to which data should be written and the data that should be written to the specified address. A write data request also includes various control signals for specifying the write operation. These address and control lines are received by memory controller 106 via bus interface 108.

The data for a read or write operation is transferred on data lines 161 and the data lines of interface bus 108, which is a bi-directional data bus. Memory controller 106 is responsible for receiving the memory access request from processor 102 and converting the input signals to access signals which are compatible with DRAM banks 130–135 or VRAM banks 136–137. In the present invention, the access signals include RAS signals 140–147, CAS signal 150–153 and a WE signal (not shown). Using techniques well-known in the art, memory controller 106 accepts many access requests from processor 102 and generates the proper memory access signals RAS, CAS and WE.

In the currently preferred embodiment of the present invention, DRAM banks 130–135 and VRAM banks 136–137 comprise RAM devices which are capable of page mode accesses. In the currently preferred embodiment, DRAM banks 130–135 and VRAM banks 136–137 are page mode RAM devices. Page mode RAM devices allow for an entire page to be accessed by placing the row address on the address bus and strobing the row address on the address bus with a RAS line for a particular row and then successively strobing each of the column addresses for an entire row using a CAS signal, such that a whole page of information is accessed. Therefore, in page mode RAM devices, both read or write cycles can access for a full row while cycling (i.e., toggling) the CAS signal.

The present invention supports VRAM's of speeds different than of the DRAM banks 130–135. In the currently preferred embodiment, one or two banks in the memory are designed, such that the memory mapping of the VRAM banks can be optionally decoupled from the remaining DRAM banks. In other words, the VRAM banks are not mapped into the address space consecutively in the present invention. Furthermore, memory controller 106 can accommodate for differences in the size and timing of the VRAM banks in the memory.

Digital image data is stored in VRAM banks 136–137 in a frame buffer. In the present invention, the frame buffer is a linear portion of memory having a predefined correspondence between a memory location in VRAM banks and a point on CRT display 123. The use of frame buffers is well-known in the art.

A digital-to-analog converter (DAC) 124 is coupled to VRAM banks 136 and 137 via lines 126. DAC 124 receives multiple pixels of image data over lines 126. In the currently preferred embodiment, each pixel may be represented by 8, 16 or 24 bits of data. The pixels are shifted out to DAC 124 using a shift register according to timing and control signals received from CRT controller 181-via lines 171 and 172. In the currently preferred embodiment, the shift register is in the VRAM banks. Also in the currently preferred embodiment, multiple pixels may be shifted for each clock cycle. The entire scan line of pixels may be shifted using multiple clock cycles.

The serial data on lines 126 is output to DAC 124 according to the address issued by CRT controller 181 on address bus 129. In the currently preferred embodiment, address bus 129 comprises a 24-bit address bus. Addresses on bus 129, as well as addresses on memory controller address bus 160, are received by multiplexer (MUX) 195. MUX 195 is also coupled to receive an address from internal address bus 160.

The output of MUX 195 is the address of the memory location to be output to CRT display 123 or a standard DRAM/VRAM RAS/CAS address. The multiplexer 195 is controlled by the address grant signal AGnt 127 and the RAS and CAS enable signal RAE/CAE# on line 128, both issued by memory controller 106. When CRT controller 181 asserts its address bus request signal AReq 191 to memory controller 106, CRT controller 181 requests control of the internal address bus of the system memory. Memory controller 106 grants the access by asserting the address bus grant signal AGnt 127 to CRT controller 181. The AGnt signal 127 also causes MUX 195 to select the address from address bus 129. With control of the address bus of memory controller 106, CRT controller 181 is able to assert the row and column addresses in succession. The assertion of the row and column addresses from address bus 129 is controlled by RAE/CAE# signal 128 coupled from memory controller 106. In the currently preferred embodiment, when the RAE/CAE# signal 128 is active high, the row address is driven onto the internal address bus, while if the RAE/CAE# signal 128 is active low, then the column address is driven onto the address bus of memory controller 106 by MUX 195. Therefore, CRT controller 181, in conjunction with MUX 195, is able to access VRAM banks 136–137.

Data transceiver 186 and address latch 187 provides the means for accessing CRT controller 181. For instance, data transceiver 186 and address latch 187 are used to program CRT controller 1 81. Data transceiver 186 is coupled to system data bus 156 and address bus 129, providing a bi-directional data path between the two. In the currently preferred embodiment, data transceiver 186 transfers data bytes. The direction of the transfer is controlled by a read/write signal (R/W#) coupled to be received from the accessing device on the system bus (e.g., the main processor). The accessing device also supplies a chip select signal (CS#) to enable CRT controller 181 and data transceiver 186, such that bus 129 can complete the access. Similarly, address latch 187 is coupled between system address bus 157 and address bus 129 to provide a bi-directional address path. Address latch 187 is coupled to receive an address enable (AEN#) signal, causing the latching of an address. Therefore, using data transceiver 186 and address latch 187, system bus devices are able to access CRT controller 181.

Once DAC 124 receives pixel data from VRAM banks 136 and 137, DAC 124 converts the pixel data into analog signals and outputs those signals on lines 122 to a CRT display 123. As pixel data is shifted from VRAM banks 136 and 137 to DAC 124, data corresponding to each pixel is converted to another form and sequentially scanned on CRT display 123. Methods of scanning pixels from a digital-to-analog converter are well-known in the art. In the currently preferred embodiment, the analog signals output from DAC 124 are red, green and blue (RGB) color signals and CRT display 123 is an RGB monitor.

Operation of the Present Invention

The present invention provides a method and apparatus for performing bit block (i.e., fly-by) data transfer operations. In the currently preferred embodiment, the bit block operations are implemented by memory controller 106 in conjunction with the DRAM and VRAM banks. A bit block engine 106A in memory controller 106 performs as a DMA controller which can perform memory-to-memory, screen-to-memory and memory-to-screen transfer bit block operations in Fly-By mode. Bit block operations comprise transferring video data between the video memory (e.g., VRAM banks 136–137) and the system memory (e.g., DRAM banks 130–135), such that video data shown on the display is controlled.

Figure 2:
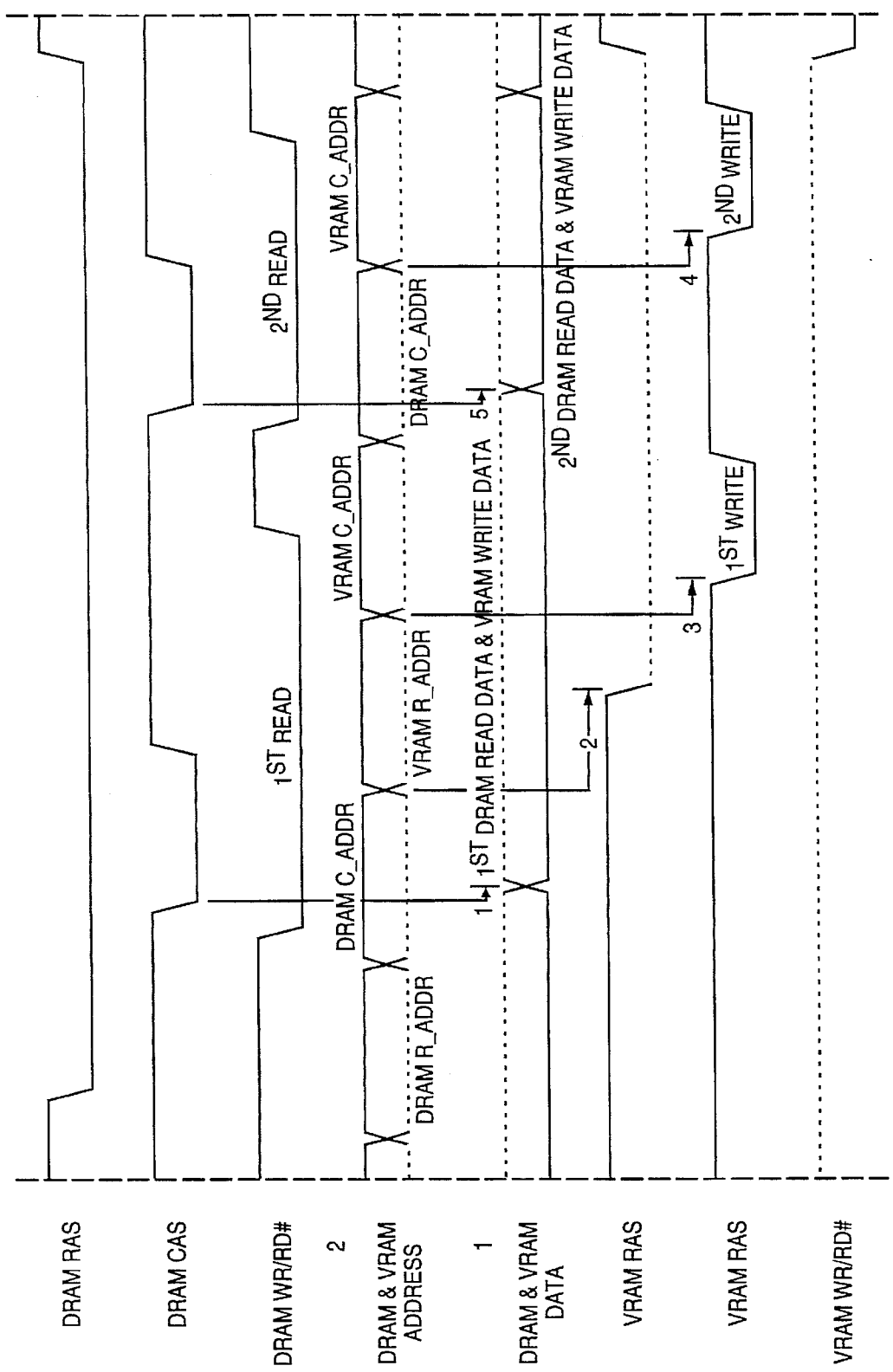
FIG. 2 is a timing diagram illustrating a fly-by memory-to-screen bit block transfer according to the present invention.

FIG. 2 illustrates a fly-by memory-to-screen bit block operation using the page mode DRAMs and VRAMs of the present invention. Referring to FIG. 2, when performing a memory-to-screen bit block operation, the data from the system memory is transferred to the video memory for display on the screen. In the present invention, the bit block operations are performed in response to the CPU request. To perform the bit block operation, memory controller 106 first drives the initial row address onto the address bus and activates the DRAM RAS for the appropriate DRAM. In the currently preferred embodiment, all of the RAS signal are active low. Activating the RAS of the appropriate DRAM strobes the row address of the DRAM, DRAM R_Addr, on the internal address bus 160. After the row address has been strobed, the column address, DRAM C_Addr, is driven onto the address bus and the appropriate DRAM CAS signal is activated, causing the DRAM column address to be strobed. The strobing of the column address, DRAM C_Addr, on address bus 160 causes the data DATA to be placed onto internal data bus 161. Once the data has been placed on data bus 161, the DRAM access has been completed.

Because the DRAM access is complete, the DRAM column address, DRAM C_Addr, is no longer needed. However, in the present invention, the DRAM read/write indication signal, DRAM WR/RD#, is kept active, even though the DRAM access has been finished. (The # sign indicates that the signal is active low) Because the DRAM WR/RD# signal remains active low, the data on data bus 161 is still valid. While the WR/RD# signal is active, memory controller 106 of the present invention drives the VRAM row address, VRAM R_Addr, onto the address bus and strobes it with the VRAM RAS, causing the VRAM address, VRAM R_Addr, to be recognized as a valid address on address bus 160. Subsequently, the VRAM column address, VRAM C_Addr, is placed on address bus 160 and strobed by the VRAM CAS signal, such that VRAM C_Addr is recognized as valid VRAM column address. The VRAM read/write indication signal, VRAM WR/RD#, is active high during the transfer, such that the strobing of the VRAM CAS signal causes the data to be written into the appropriate VRAM bank. Therefore, while the data on the data bus is still valid, the second write access Is performed by strobing the appropriate RAS and CAS signals.

Note that in prior art systems, the read/write signal is deactivated after the data read access Is performed because the data remains in the CPU until the CPU performs its next access. Because the CPU is not required in the present invention when processing the access, the present invention allows the data to be toggled on internal data bus 161 while the VRAM row and column addresses are strobed to complete the data transfer.

Referring back to FIG. 2, after the first transfer of data, the next column address for the DRAM is placed on address bus 160 and strobed by the DRAM RAS concurrently with the activation of the WR/RD# signal, causing the next data to be read onto data bus 161. The next VRAM column address is placed onto bus 160 and strobed by the VRAM CAS signal, thereby causing the data to be written into the VRAM bank. This alternating between the column addresses of the DRAM and VRAM banks results in an entire row of data being transferred.

Note that memory controller 106 performs in the same manner for a fly-by screen-to-memory bit block operation with the exception that the order of the VRAM and DRAM accesses are reversed. In other words, the VRAM is accessed first and then the DRAM is accessed to complete the transfer.

Therefore, in the present invention, DRAM row address, the DRAM column address, the VRAM row address and the VRAM column address are all pipelined onto internal address bus 160 in conjunction with the proper strobing of the RAS/CAS signals. Once the RAS has been activated for both the DRAM and VRAM banks, the fly-by transfers of data in the present invention requires only the CAS signal cycling for both the VRAM and the DRAM banks. Thus, the use of shared control, data and address buses in a unified DRAM and VRAM memory controller 106 and the use of multi-bank DRAM and VRAM systems with page mode access allow the present invention to perform fly-by bit block transfers.

Note that for memory controllers of the present invention to complete the fly-by transfers, the starting DRAM address of the data, the length of the DRAM block, and the VRAM starting address are required. Therefore, by the use of page mode DRAMs, which allow the hardware to cycle the column addresses while repeatedly asserting the CAS signal for the same row address, and by having the VRAM and DRAM banks share common data and address buses, the present invention is able to perform the fly-by bit block transfers.

Whereas many alterations and applications of the present invention will no doubt become apparent to a person of ordinary skill in the art after having read the foregoing description, it is understood that the particular embodiment shown and described by illustration are in no way intended to be limiting. Therefore, reference to details of the preferred embodiments are not intended to limit the scope of the claims which themselves recite only those features regarded as essential to the invention.

Thus, a method and apparatus for performing fly-by bit block transfers has been described.

I claim:

1. A method of transferring data between a first bank of a memory and a second bank of said memory, said first and second banks being coupled by a common data bus and a common address bus in a computer system, wherein one of said first or second banks comprises a video memory bank, and further wherein access to said first bank and said second bank is controlled by a single integrated controller, said method comprising the steps of:

said controller strobing a first memory row address of said first bank, such that a valid row address for said first bank appears on said common address bus;

said controller activating a read data control signal for said first bank;

said controller activating a write data control signal for said second bank;

said controller strobing a first memory column address of said first bank, such that data corresponding to said first row address and said first column address of said first bank is driven onto said common data bus;

said controller strobing a second memory row address of said second bank while said read data control signal for said first bank is active, such that a valid row address for said second bank appears on said common address bus while said read data control signal is active;

said controller strobing a second memory column address of said second bank while said read data control signal for said first bank is active and while said write data control signal for said second bank is active, such that said data is written from said common data bus into said second bank.

2. The method defined in claim 1 further comprising the step of deactivating said read data control signal for said first bank after said data is written from said common data bust into said second bank.

3. The method defined in claim 2 further comprising the steps of:

(a) activating said read data control signal for said first bank;

(b) strobing a next column address of said first bank, such that said data corresponding to said first row address and said next column address of said first bank is driven onto said common data bust from said first bank; and (c) strobing a next column address of said second bank while said read data control signal for said first bank is active and while a write data control signal for said second bank is active, such that said data is written form said common data bus into said second bank.

4. The method as defined in claim 3 further comprising the step of repeating steps (a)–(c) until data corresponding to an entire row of said first bank has been written into said second bank.

5. The method as defined in claim 1 wherein said first bank comprises a video memory bank and said second bank comprises a non-video memory bank, such that a screen-to-memory bit block transfer is completed.

6. The method as defined in claim 1 wherein said first bank comprises a non-video memory bank and said second bank comprises a video memory bank, such that a memory-to-screen bit block transfer is completed.

7. The method defined in claim 1 wherein said first bank of memory and said second bank of memory operate at different speeds.

8. The method of claim 1 further comprising the step of specifying a length of a data block in said first bank to be transferred to said second bank and said second memory row address of said second bank prior to said controller strobing said first memory row address of said first bank.

9. A method of performing a screen-to-memory data transfer from a VRAM bank means for storing video data to a DRAM bank means for storing data, said VRAM bank means and said DRAM bank means being coupled by a common data bus and a common address bus in a computer system, and further wherein access to said VRAM bank means and said DRAM bank means is controlled by a single integrated controller, said method comprising the steps of:

said controller strobing a first VRAM row address, such that a valid VRAM row address appears on said common address bus;

said controller activating a VRAM read data control signal;

said controller activating a DRAM write data control signal;

said controller strobing a first VRAM column address, such that data corresponding to said first VRAM row address and said first VRAM column address is driven onto said common data bus from said VRAM bank means;

said controller strobing a first DRAM row address while said VRAM read data controll signal is active, such that a valid DRAM row address appears on said common address bus; and said controller strobing a first DRAM column address while said VRAM read data control signal is active and while said DRAM write data control signal is active, such that said data is written from said common data bus into said DRAM bank means for storage.

10. The method defined in claim 9 further comprising the steps of:

(a) deactivating said VRAM read data control signal after said data is written from said data bus into said DRAM bank means;

(b) activating said VRAM read data control signal;

(c) strobing a next VRAM column address, such that data corresponding to said next VRAM column address and said first VRAM row address is driven onto said common data bus from said VRAM bank means;

(d) strobing a next DRAM column address while said VRAM read data control signal is active and while said DRAM write data control signal is active, such that said data is written from said common data bus into said DRAM bank means;

(e) repeating steps (b)–(d) until data corresponding to an entire VRAM row has been written into said DRAM bank means.

11. The method defined in claim 9 further comprising the step of specifying a length of a data block in said VRAM bank means to be transferred to said DRAM bank means and said first DRAM row address prior to said controller strobing said first VRAM row address.

12. A method of performing a memory-to-screen data transfer between a VRAM bank means for storing video data and a DRAM bank means for storing data, said VRAM bank means and DRAM bank means being coupled by a common data bust and a common address bus in a computer system, and further wherein access to said VRAM bank means and said DRAM bank means is controlled by a single integrated controller, said method comprising the steps of:

said controller strobing a first DRAM row address, such that a valid DRAM row address appears on said common address bus;

said controller activating a DRAM read data control signal;

said controller activating a VRAM write data control signal;

said controller strobing a first DRAM column address, such that corresponding to said first DRAM row address and said first DRAM column address is driven onto said common data bus from said DRAM bank means;

said controller strobing a first VRAM row address while said DRAM read data control signal is active, such that a valid VRAM row address appears on said common address bus; and said controller strobing a first VRAM column address while said DRAM read data control signal is active and while said VRAM write data control signal is active, such that said data is written from said common data bus into said VRAM bank means for storage.

13. The method defined in claim 12 further comprising the steps of:

(a) deactivating said DRAM read data control signal after said data is written from said data bus into said VRAM bank means;

(b) activating said DRAM read data control signal;

(c) strobing a next DRAM column address, such that data corresponding to said next DRAM column address and said first DRAM row address is driven onto said common data bus from said DRAM bank means;

(d) strobing a next VRAM column address while said DRAM read data control signal is active and while said VRAM write data control signal is active, such that said data is written from said common data bus into said VRAM bank means;

(e) repeating steps (b)–(d) until data corresponding to an entire DRAM row has been written into said VRAM bank means.

14. The method defined in claim 12 further comprising the step of specifying a length of a data block in said DRAM bank means to be transferred to said VRAM banks means and said first VRAM row address prior to said controller strobing said first DRAM row address.

15. A memory subsystem in a computer system comprising:

a common data bus for transferring data;

a common address bus for addressing memory locations;

a multi-bank memory for storing data comprising a first set of memory banks and a second set of memory banks, each of said first and second sets of memory banks being coupled to said common data bus and said common address bus, wherein said first set of memory banks stores data not being currently displayed and said second set of memory banks stores data being displayed;

a first read/write data control signal for indicating whether data is read from or written to said first set of memory banks, said first read/write data control signal being coupled to said first set of memory banks;

a second read/write data control signal for indicating whether data is read from or written to said second set of memory banks, said second read/write data control signal being coupled to said second set of memory banks, said second read/write data control signal operating concurrently with said first read/write data control signal during transfers between said first set of memory banks and said second set of memory banks; and a memory controller coupled to said common data bus, said common address bus, said multi-bank memory and said first and second read/write data control signals for controlling access to said multi-bank memory, wherein data transfers between said first set of memory banks and said second set of memory banks occur on said common data bus and are controlled by said memory controller and said first and second read/write data control signals.

16. The memory subsystem as defined in claim 15 wherein said first set of memory banks comprises at least one DRAM device.

17. The memory subsystem as defined in claim 16 wherein said DRAM device comprises at least one page mode DRAM device.

18. The memory subsystem as defined in claim 15 wherein said second set of memory banks comprises at least one VRAM device.

19. The memory subsystem as defined in claim 15 wherein said VRAM device comprises at least one page mode VRAM device.

20. The memory subsystem as defined in claim 15 wherein said first set of memory banks comprises at least one DRAM bank and said second set of memory banks comprises at least one VRAM bank, each of which is accessed according to row address strobe (RAS) and column address strobe (CAS) signals generated by said memory controller, such that when data is transferred between said at least one DRAM bank and said at least one VRAM bank, said RAS signals are activated for said at least one DRAM bank and said at least one VRAM bank and said CAS signals are cycled for both said at least one DRAM bank and said at least one VRAM bank, such that a page mode transfer occurs.

21. A method for transferring data from a first bank to a second bank in a system memory having a plurality of banks, wherein said plurality of banks are coupled using a shared address bus and a shared data bus, said method comprising the steps of:

pipelining row and column addresses of said first bank on said shared address bus in conjunction with proper strobing of row address strobe (RAS) and column address strobe (CAS) signals and activation of a read data control signal of said first bank, such that data is read from said first bank on to said shared data bus; and pipelining row and column addresses of said second bank on said shared address bus in conjunction with proper strobing of said RAS and CAS signals and activation of a write data control signal of said second bank while said read data control signal of said first bank is active, such that said data is written from said shared data bus to said second bank.

22. The method as defined claim 21 further comprising the step of cycling said CAS signal for both said first and second banks, such that a row of data transfers from said first bank to said second bank on said shared data bus.

* * * * *